United States Patent [19]

Davies et al.

[11] Patent Number: 5,563,437

[45] Date of Patent: Oct. 8, 1996

[54] SEMICONDUCTOR DEVICE HAVING A LARGE SENSE VOLTAGE

[75] Inventors: Robert B. Davies; Warren J. Schultz, both of Tempe, Ariz.

[73] Assignee: Motorola, Inc., Schaumburg, Ill.

[21] Appl. No.: 839,413

[22] Filed: Feb. 21, 1992

[51] Int. Cl.$^6$ .................. H01L 29/76; H01L 21/265
[52] U.S. Cl. .................. 257/329; 257/335; 257/336; 257/337; 257/338; 257/339; 257/341; 257/390; 257/500; 257/504; 257/547; 257/548; 257/550; 437/48; 437/74; 437/913
[58] Field of Search ............................ 257/329, 335, 257/336, 337, 338, 339, 341, 390, 500, 504, 547, 548, 550; 437/48, 74, 913

[56] References Cited

U.S. PATENT DOCUMENTS 4,931,844  6/1990  Zommer ................. 357/23.4

*Primary Examiner*—Edward Wojciechowicz
*Attorney, Agent, or Firm*—Miriam Jackson

[57] ABSTRACT

A large sense voltage is produced by the semiconductor device of the present invention. The semiconductor device, utilizing current mirror techniques, is comprised of a power MOSFET having a plurality of power cells and a plurality of sense cells formed in a semiconductor epitaxial layer. The large sense voltage is provided by isolating and separating the plurality of power cells from the plurality of sense cells by at least the thickness of the semiconductor epitaxial layer. Isolation can be provided by forming a plurality of inactive cells or an elongated cell between the plurality of power cells and the plurality of sense cells. In addition, high voltage capabilities can be maintained by including a partially active region adjacent the power cells to provide for good termination.

18 Claims, 2 Drawing Sheets

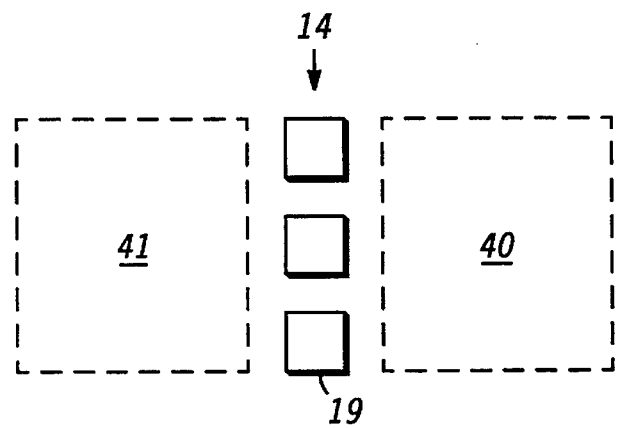
FIG. 3
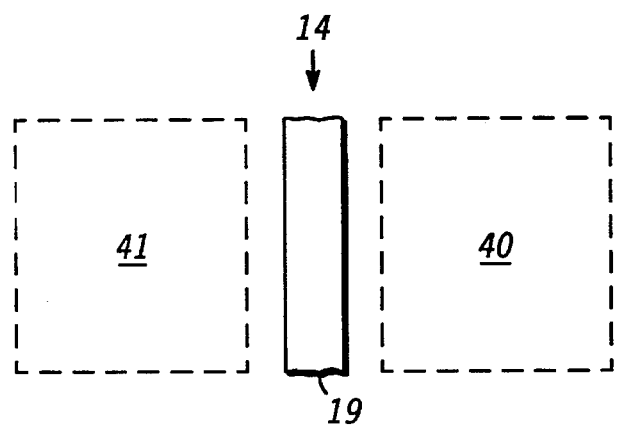
FIG. 4
FIG. 5
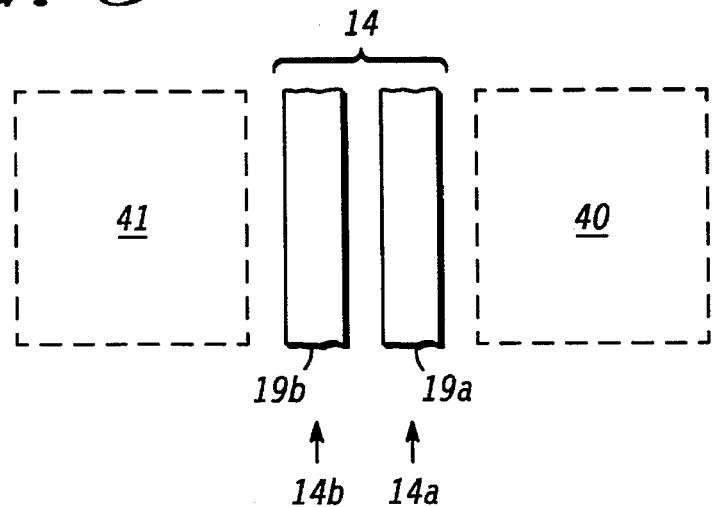

SEMICONDUCTOR DEVICE HAVING A LARGE SENSE VOLTAGE

BACKGROUND OF THE INVENTION

This invention relates, in general, to semiconductor devices, including, but not limited to, a semiconductor device having a large sense voltage.

Current mirror techniques have been used for current and voltage sensing in power MOSFETs. A conventional current mirror device provides an ability to perform substantially lossless current sensing in power control circuits. These devices are used in power supplies and motor controls. Current mirror devices have a small number of sense cells to sense voltage and current and a large number of power cells to switch and control electrical power to desired loads.

Although substantially lossless current sensing is an extremely desirable feature, the marketability of current mirror devices has been limited because of the relatively small amount of sense voltage that they produce. The sense voltage is small because the open mirror voltage (the sense voltage when the load on the sense cells is infinite) senses the voltage drop across the MOSFET channel only, which is only a small percentage of the voltage from drain to source ($V_{DS(on)}$). In higher voltage devices, those having a breakdown voltage from drain to source ($BV_{DSS}$) approximately greater than 200 volts, the usable amount of sense voltage is only about 10% of $V_{DS(on)}$. It would be desirable to increase the usable amount of sense voltage to a higher range for applications in which overcurrent shutdown must be initiated in order to be able to read the sense voltage above the noise.

In general, it would also be desirable to improve the integrity of the high voltage capability of semiconductor devices that utilize current mirror techniques. In addition, for some applications it would be desirable to improve the accuracy of the sensing capabilities.

SUMMARY OF THE INVENTION

In accordance with the present invention a semiconductor device utilizing current mirror techniques having a large sense voltage is fabricated. The semiconductor device is comprised of a MOSFET having a plurality of power cells and a plurality of sense cells formed in a semiconductor epitaxial layer, wherein the plurality of sense cells are isolated and separated from the plurality of power cells by at least the thickness of the semiconductor epitaxial layer.

In another embodiment, the integrity of the high voltage capabilities are attained and the accuracy of the ratio between power cells to sense cells is maintained by isolating the power cells and the sense cells by an isolation region comprised of two regions. A first region is electrically connected to the plurality of power cells and is comprised of a region which is partially active. A second region is electrically connected to the plurality of sense cells and is comprised of an inactive region.

BRIEF DESCRIPTION OF THE DRAWINGS

FIG. 3 illustrates a simplified top view of a portion of an embodiment of the present invention showing a first embodiment of an isolation region;

FIG. 4 illustrates a simplified top view of a portion of an embodiment of the present invention showing a second embodiment of the isolation region; and FIG. 5 illustrates a simplified top view of a portion of an embodiment of the present invention showing a third embodiment of the isolation region.

DETAILED DESCRIPTION OF THE DRAWINGS

Figure 1:
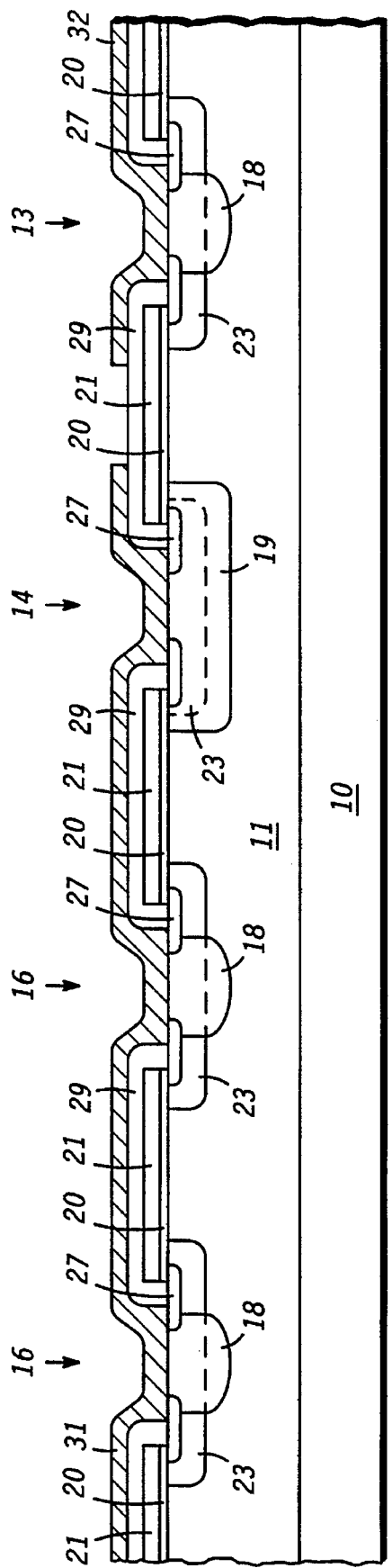
FIG. 1 illustrates an enlarged, cross-sectional view of a portion of a first embodiment of the present invention.

FIG. 1 illustrates an enlarged, cross-sectional view a portion of an embodiment of the present invention. What is shown is a current mirror device or power MOSFET utilizing current mirror techniques fabricated on a semiconductor layer typically comprised of a supporting structure or semiconductor substrate 10 and a semiconductor epitaxial layer 11 of a first conductivity type formed thereon. A plurality of power cells 16 and a plurality of sense cells 13 are formed in semiconductor epitaxial layer 11.

Figure 2:
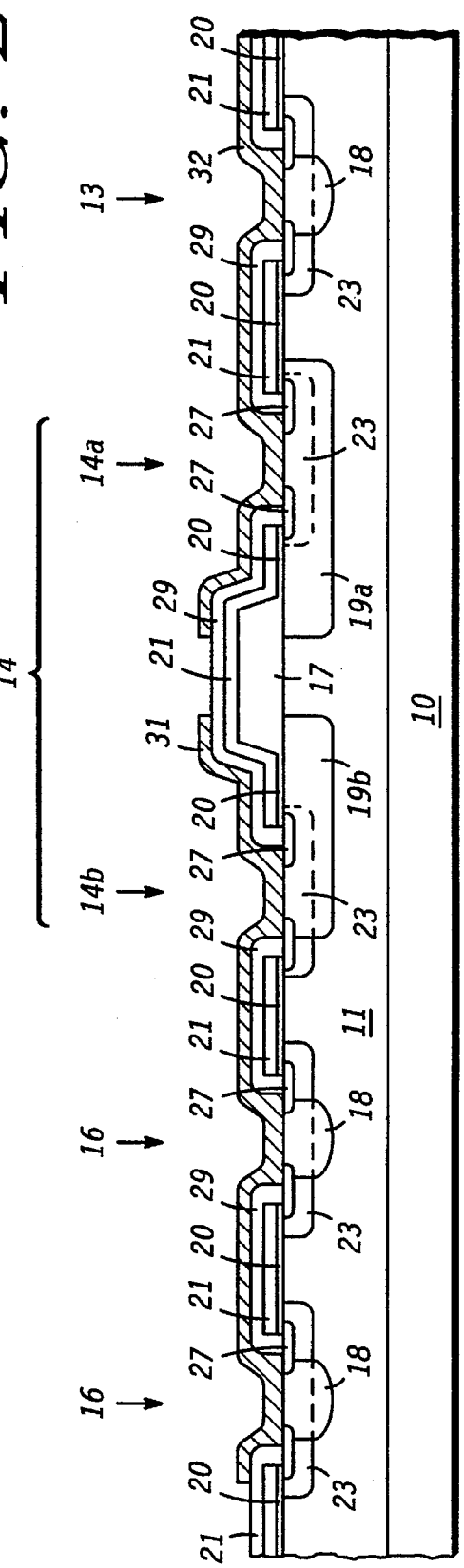
FIG. 2 illustrates an enlarged, cross-sectional view of a portion of a second embodiment of the present invention.

The formation of power cells 16 and sense cells 13 is hereinafter described briefly because the fabrication of power cells 16 is well known in the art. The structure shown in FIGS. 1 and 2 is only intended to illustrate one embodiment of a power MOSFET structure, other slightly different structures can be fabricated which result in essentially the same or similar device. Sense cells 13 are identical to power cells 16. These cells 13 and 16 are comprised of a first region 18 of a second conductivity type extending from the surface of semiconductor epitaxial layer 11. A second region 23 of the second conductivity type which is larger than first region 18, extends from the surface of semiconductor epitaxial layer 11 and partially overlaps first region 18, and is more lightly doped than region 18. The place where second region 23 overlaps first regions 18 is shown by a dotted line for illustrative purposes. A source region 27 is formed inside each region 23 and partially overlapping region 18. A gate oxide layer 20 and a gate polysilicon layer 21 are formed on a portion of second region 23 and source region 27. An insulating layer 29 is formed on gate layer 21. A metallization layer 31 electrically connects power cells 16 and an isolation region 14 (described below). A metallization layer 32 electrically connects sense cells 13 to each other. However, isolation regions 14 may be electrically connected to sense cells 13 instead of power cells 16.

The difference between power cells 16 or sense cells 13 and isolation region 14 is that region 19 (which is formed at the same time region 18 is formed) is formed to extend out past source region 27 at the surface of semiconductor epitaxial layer 11 into the channel region of the MOSFET. In power cells 16 and sense cells 13, first region 18 does not extend past source region 27 at the surface of the semiconductor epitaxial layer. The channel region is heavily doped in isolation region 14, because region 19, which is more heavily doped than region 23, is formed in this area. This heavy doping prevents the channel region in isolation region 14 from turning on during normal operation. Thus, isolation region 14 is comprised of an inactive region. It is preferable to form an inactive region in the manner described above because it does not add any extra processing steps to the fabrication of the current mirror device, however, an inactive region may be provided by other suitable means.

FIG. 2 illustrates an enlarged, cross-sectional view of a portion of a second embodiment of the present invention. The same regions or layers as shown in the first embodiment are referenced by the same numerals. The difference between the first and the second embodiments is that isolation region 14 is comprised of two separate regions 14a and 14b. In addition, a field oxide layer 17 underlies gate polysilicon layer 21 in between region 14a and region 14b. Field oxide layer 21 also encompasses gate oxide layer 20, however, the delineation of each layer is not discernable, and therefore not shown. Region 14b has a region 19b formed in epitaxial layer 11 which extends from the surface of epitaxial layer 11 and does not extend out past source region 27 only on the side adjacent power cells 13. Region 14b is electrically connected to and adjacent power cells 16. In this embodiment, a heavily doped channel region is not formed at the surface of second region 23 adjacent to source region 27 underlying gate region 21 on the side adjacent power cells 16. In other words, region 14b forms a region which has a partially active portion. Region 14a is essentially the same as the single isolation region 14 shown in FIG. 1, except that region 14a is electrically connected to sense cells 13, and region 19a is shown to extend farther out past source region 27 than region 19 in FIG. 1. Region 14a is formed adjacent sense cells 13.

Isolation region 14 shown in this embodiment is necessary for fabricating high voltage devices in order to maintain the integrity of high voltage capabilities of the device. This structure provides for a good termination for power cells 16. In addition, by having the part of isolation region 14, region 14a electrically connected to sense cells 13, be totally inactive, a fairly accurate ratio of sense cells 13 to power cells 16 is attained. Isolation region 14b which is partially active can be used with power cells 16 because there are a large number of power cells 16 as compared to the number of sense cells 13. The ratio of power cells to sense cells is important when the accuracy of the sense voltage is important.

As explained previously, sense voltage in prior art current mirror devices is small because the open mirror voltage senses the voltage drop across the MOSFET's channel only. In higher voltage devices, the usable amount of sense voltage is only about 10% of $V_{DS(on)}$. Lower voltage devices work better than higher voltage devices, because a larger percentage of $V_{DS(on)}$ occurs in the channel region of the device. However, it is still desirable to increase the sense voltage of the lower voltage devices. The current mirror device of the present invention significantly increases usable sense voltage by placing sense cells 13 far enough from power cells 16 to substantially eliminate power cell drain current flow in the drain or semiconductor epitaxial layer 11 immediately underneath sense cells 13. This is based on the assumption that current will spread at a 45 degree angle. By designing the device in this manner, the open mirror voltage senses the voltage drop across the bulk resistance in the drain or semiconductor epitaxial layer 11, as well as the voltage drop across the MOSFET's channel. Thus, the key to increasing the amount of sense voltage is to separate power cells 16 from sense cells 13 by at least the thickness of semiconductor epitaxial layer 11. However, for certain voltage devices, it may be desirable to increase the distance power cells 16 are separated from sense cells 13. For example, a device having a 250 $BV_{dss}$ with power cells 16 separated from sense cells 13 by a distance of approximately 5 times the thickness of semiconductor epitaxial layer 11 was found to increase the usable amount of sense voltage to approximately 95% of $V_{DS(on)}$ and high voltage capabilities were attained.

FIG. 3 illustrates a simplified top view of a portion of an embodiment of the present invention showing a first embodiment of isolation region 14 of FIG. 1. To simplify the drawing, boxes 40 and 41 are shown to represent a plurality of sense cells 13 and a plurality of power cells 16, respectively. FIG. 3 also only illustrates the top view of the region 19 of isolation region 14 in order to simplify the drawing. In FIG. 3, isolation region 14 is comprised of a plurality of inactive cells formed between power cells 16 and sense cells 13.

FIG. 4 illustrates a simplified top view of a portion of an embodiment of the present invention showing a second embodiment of isolation region 14 of FIG. 1. To simplify the drawing, boxes 40 and 41 are shown to represent a plurality of sense cells 13 and a plurality of power cells 16, respectively. FIG. 4 also only illustrates the top view of region 19 of isolation region 14 in order to simplify the drawing. In FIG. 4, isolation region 14 is comprised of an elongated cell formed between power cells 16 and sense cells 13.

FIG. 5 illustrates a simplified top view of a portion of an embodiment of the present invention showing a first embodiment of isolation region 14 of FIG. 2. To simplify the drawing, boxes 40 and 41 are shown to represent a plurality of sense cells 13 and plurality of power cells 16, respectively. FIG. 5 also only illustrates the top view of regions 19a and 19b of isolation region 14 (comprised of regions 14a and 14b) in order to simplify the drawing. In FIG. 4, isolation regions 14a and 14b are comprised of elongated cells formed between power cells 16 and sense cells 13.

As can be readily seen, the current mirror device of the present invention provides for an improved sense voltage. The improved sense voltage is obtained by separating power cells 16 from sense cells 13 by at least the thickness of the drain or semiconductor epitaxial layer 11. In addition, by separating power cells 16 and sense cells 13 by isolation region 14 comprised of a first region 14b which is electrically connected to power cells 16 and has a partially active portion and a second region 14a electrically connected to sense cells 13 which is totally inactive, high voltage capability and the accuracy of the ratio of sense cells to power cells was attained.

We claim:

1. A semiconductor device, comprising:

a semiconductor epitaxial layer of the first conductivity type having a thickness;

a plurality of sense cells formed in the semiconductor epitaxial layer each comprised of a region of a second conductivity type and a source region of the first conductivity type formed in the region of the second conductivity type; and a plurality of power cells formed in the semiconductor epitaxial layer each comprised of a region of a second conductivity type and a source region of the first conductivity type formed in the region of the second conductivity type, wherein the plurality of sense cells are separated from the plurality of adjacent power cells by at least thickness of the semiconductor epitaxial layer.

2. The semiconductor device of claim 1 further comprising an isolation region formed in the semiconductor epitaxial layer between the plurality of sense cells and the plurality of adjacent power cells comprised of a plurality of inactive cells each comprised of a region of second conductivity type and a source region of the first conductivity type formed in the region of the second conductivity type, and having a channel region which does not turn on.

3. The semiconductor device of claim 1 further comprising an isolation region formed in the semiconductor epitaxial layer between the plurality of sense cells and the plurality of adjacent power cells comprised of at least one elongated partially inactive cell comprised of a region of second conductivity type and a source region of the first conductivity type formed in the region of the second conductivity type; and having a portion of a channel region which does not turn on.

4. The semiconductor device of claim 1 further comprising an isolation region formed in the semiconductor epitaxial layer between the plurality of sense cells and the plurality of adjacent power cells comprised of an inactive isolation region electrically connected to and adjacent the plurality of sense cells and a partially inactive isolation region electrically connected to and adjacent the plurality of power cells.

5. A semiconductor device, comprising:

a semiconductor epitaxial layer of a first conductivity type having a surface and a thickness;

a plurality of power cells formed in the semiconductor epitaxial layer; and a plurality of sense cells formed in the semiconductor epitaxial layer, wherein the plurality of power cells and the plurality of sense cells are comprised of a first region of a second conductivity type extending from the surface of the semiconductor epitaxial layer, a second region of the second conductivity type extending from the surface of the semiconductor epitaxial layer which is more lightly doped than the first region and formed partially overlapping the first region, and a third region of the first conductivity type formed inside the second region such that the first region does not extend past the third region at the surface of the semiconductor epitaxial layer, and wherein the plurality of power cells are isolated from the plurality of adjacent sense cells by an isolation region which is comprised of a fourth region of the second conductivity type extending from the surface of the semiconductor epitaxial layer and a fifth region of the second conductivity type extending from the surface of the semiconductor epitaxial layer which is more lightly doped than the fourth region and is formed inside the fourth region and a sixth region of the first conductivity type formed inside the fifth region.

6. The semiconductor device of claim 5 wherein the plurality of sense cells are separated by the plurality of adjacent power cells by at least the thickness of the semiconductor epitaxial layer.

7. The semiconductor device of claim 5 wherein the plurality of sense cells are separated by the plurality of adjacent power cells by at least five times the thickness of the semiconductor epitaxial layer.

8. The semiconductor device of claim 5 wherein the isolation region is further comprised of a seventh region of the second conductivity type extending from the surface of the semiconductor epitaxial layer adjacent the power cells and an eighth region of the second conductivity type extending from the surface of the semiconductor epitaxial layer which is more lightly doped than the seventh region and is formed partially overlapping the seventh region and a ninth region of the first conductivity type formed inside the eighth region such that the seventh region does not extend past the ninth region only on a side adjacent the plurality of power cells.

9. A semiconductor device, comprising:

a semiconductor epitaxial layer of the first conductivity type having a thickness;

a plurality of sense cells formed in the semiconductor epitaxial layer each comprised of a region of a second conductivity type and a source region of the first conductivity type formed in the region of the second conductivity type; and a plurality of power cells formed in the semiconductor epitaxial layer each comprised of a region of a second conductivity type and a source region of the first conductivity type formed in the region of the second conductivity type, wherein the plurality of sense cells are placed far enough away from the plurality of adjacent power cells to substantially eliminate a power cell drain current flow in the semiconductor epitaxial layer immediately underneath the plurality of sense cells.

10. A method of making a semiconductor device comprising the steps of:

providing a semiconductor epitaxial layer of the first conductivity type;

forming a plurality of sense cells in the semiconductor epitaxial layer each comprised of a region of a second conductivity type and a source region of the first conductivity type formed in the region of the second conductivity type; and forming a plurality of power cells in the semiconductor epitaxial layer each comprised of a region of a second conductivity type and a source region of the first conductivity type formed in the region of the second conductivity type, wherein the plurality of sense cells are separated from the plurality of adjacent power cells by at least the thickness of the semiconductor epitaxial layer.

11. The method of claim 10 further comprising forming an isolation region in the semiconductor epitaxial layer between the plurality of sense cells and the plurality of adjacent power cells comprised of a plurality of inactive cells each comprised of a region of second conductivity type and a source region of the first conductivity type formed in the region of the second conductivity type, and having a channel region which does not turn on.

12. The method of claim 10 further comprising forming an isolation region in the semiconductor epitaxial layer between the plurality of sense cells and the plurality of adjacent power cells comprised of at least one elongated partially inactive cell surrounding the plurality of sense cells comprised of a region of second conductivity type and a source region of the first conductivity type formed in the region of the second conductivity type, and having a portion of a channel region which does not turn on.

13. The method of claim 10 further comprising forming an isolation region in the semiconductor epitaxial layer comprised of an inactive region electrically connected to and adjacent the plurality of sense cells and a partially inactive isolation region electrically connected to and adjacent the plurality of power cells.

14. A method of making a semiconductor device, comprising the steps of:

providing a semiconductor epitaxial layer of a first conductivity type having a thickness;

forming a plurality of power cells in the semiconductor epitaxial layer;

forming a plurality of sense cells in the semiconductor epitaxial layer, wherein the plurality of power cells and the plurality of sense cells are comprised of a first region of a second conductivity type extending from the surface of the semiconductor epitaxial layer, a second region of the second conductivity type extending from the surface of the semiconductor epitaxial layer which is more lightly doped than the first region and formed partially overlapping the first region, and a third region of the first conductivity type formed inside the second region such that the first region does not extend past the third region at the surface of the semiconductor epitaxial layer; and forming an isolation region in the semiconductor epitaxial layer to isolate the plurality of sense cells from the plurality of adjacent power cells, wherein the isolation region is comprised of at least one fourth region of the second conductivity type extending from the surface of the semiconductor epitaxial layer and at least one fifth region of the second conductivity type extending from the surface of the semiconductor epitaxial layer which is more lightly doped than the fourth region and is formed inside the fourth region, and at least one sixth region of the first conductivity type formed inside the fifth region such that the fourth region extends past the sixth region.

15. The method of claim 14 wherein the plurality of sense cells are separated from the plurality of adjacent power cells by at least the thickness of the semiconductor epitaxial layer.

16. The method of claim 14 wherein the plurality of sense cells are separated from the plurality of adjacent power cells by at least five times the thickness of the semiconductor epitaxial layer.

17. The method of claim 14 wherein forming the isolation region is further comprised of the step of forming at least one seventh region of the second conductivity type extending from the surface of the semiconductor epitaxial layer adjacent the power cells and at least one eighth region of the second conductivity type extending from the surface of the semiconductor epitaxial layer which is more lightly doped than the seventh region and is formed partially overlapping the seventh region, and at least one ninth region of the first conductivity type formed inside the eighth region such that the seventh region does not extend past the ninth region only on a side adjacent the plurality of power cells.

18. A method of making a semiconductor device comprising the steps of:

providing a semiconductor epitaxial layer of the first conductivity type;

forming a plurality of sense cells in the semiconductor epitaxial layer each comprised of a region of a second conductivity type and a source region of the first conductivity type formed in the region of the second conductivity type; and forming a plurality of power cells in the semiconductor epitaxial layer each comprised of a region of a second conductivity type and a source region of the first conductivity type formed in the region of the second conductivity type, wherein the plurality of sense cells are placed far enough away from the plurality of adjacent power cells to substantially eliminate a power cell drain current flow in the semiconductor epitaxial layer immediately underneath the plurality of sense cells.

* * * * *